US012139042B2

(12) United States Patent
Li et al.

(10) Patent No.: US 12,139,042 B2
(45) Date of Patent: Nov. 12, 2024

(54) VEHICLE CONTROL BASED ON BATTERY TEMPERATURE ESTIMATION

(71) Applicant: FORD GLOBAL TECHNOLOGIES, LLC, Dearborn, MI (US)

(72) Inventors: Yonghua Li, Ann Arbor, MI (US); Xiaohong Nina Duan, Canton, MI (US); Qi Jiao, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 163 days.

(21) Appl. No.: 17/884,189

(22) Filed: Aug. 9, 2022

(65) Prior Publication Data

US 2024/0051432 A1 Feb. 15, 2024

(51) Int. Cl.
| | |
|---|---|
| B60L 58/25 | (2019.01) |
| B60L 3/00 | (2019.01) |
| B60L 50/60 | (2019.01) |
| G01R 31/374 | (2019.01) |
| H01M 10/48 | (2006.01) |
| H02J 7/00 | (2006.01) |

(52) U.S. Cl.
CPC .......... B60L 58/25 (2019.02); B60L 3/0046 (2013.01); B60L 50/60 (2019.02); H02J 7/0063 (2013.01); G01R 31/374 (2019.01); *H01M 10/486* (2013.01); *H01M 2220/20* (2013.01); *H02J 7/00309* (2020.01)

(58) Field of Classification Search
CPC ........ B60L 58/25; B60L 50/60; B60L 3/0046; H02J 7/0063; H02J 7/00309; G01R 31/374; H01M 10/486; H01M 2220/20
See application file for complete search history.

(56) References Cited

U.S. PATENT DOCUMENTS

| | | | |
|---|---|---|---|
| 9,893,394 B2 | 2/2018 | Shin et al. | |
| 10,059,222 B2 | 8/2018 | He | |
| 2015/0063404 A1* | 3/2015 | Chang | B60L 58/24 374/4 |
| 2019/0288344 A1* | 9/2019 | Nakao | G01R 31/3648 |
| 2021/0273270 A1* | 9/2021 | Fujikawa | B60L 58/12 |
| 2022/0131400 A1* | 4/2022 | Nakao | H01M 10/44 |
| 2023/0333170 A1* | 10/2023 | Kim | H02J 7/0048 |

FOREIGN PATENT DOCUMENTS

CN 106876826 A 6/2017

OTHER PUBLICATIONS

Lin et al., A lumped-parameter electro-thermal model for cylindrical batteries, Journal of Power Sources, 257 (2014) 1-11.
Lin et al., Quadruple Adaptive Observer of the Core Temperature in Cylindrical Li-ion Batteries and their Health Monitoring, 2012 American Control Conference, Jun. 27-Jun. 29, 2012, 578-583.

* cited by examiner

*Primary Examiner* — Zoheb S Imtiaz
(74) *Attorney, Agent, or Firm* — David B. Kelley; Brooks Kushman P.C.

(57) ABSTRACT

A vehicle includes a battery, a motor, and one or more controllers. The controllers, responsive to data indicative of an internal cell temperature of one or more cells of the battery exceeding a threshold, decrease power output from the battery to the motor. The data is based on a surface temperature of at least one of the cells and a cell heating power parameter derived from a plurality of parameters and via a delay timer and a filter.

17 Claims, 2 Drawing Sheets

VEHICLE CONTROL BASED ON BATTERY TEMPERATURE ESTIMATION

TECHNICAL FIELD

The present disclosure relates to operating a vehicle battery using battery cell temperatures estimated based on various factors.

BACKGROUND

Electric vehicles rely on one or more traction batteries to provide power for propulsion. Each traction battery may include a plurality of cells connected in series and/or parallel. Heat may be generated when the battery cells are being charged or discharged. Battery cell temperature may affect the performance of the traction battery.

SUMMARY

A vehicle has a battery including a plurality of cells, a temperature sensor located at a surface of one of the cells to measure a surface temperature, a motor, and one or more controllers. The one or more controllers, responsive to data indicative of an internal cell temperature of one or more of the cells exceeding a threshold, decrease power output from the battery to the motor. The data is based on the surface temperature and a cell heating power parameter derived from a plurality of parameters and via a delay timer and a filter.

A method for a vehicle including a motor and a traction battery with a plurality of cells, comprises measuring a surface temperature of one of the cells, and responsive to data describing an internal cell temperature of one or more of the cells exceeding a threshold, adjusting power output from the traction battery to the motor. The data is derived from the surface temperature and a temperature compensation factor that is based on output resulting from a plurality of parameters being processed via a delay timer and a first order filter.

A vehicle power system has a battery including a plurality of cells and one or more controllers that, responsive to data describing an internal cell temperature of one or more of the cells exceeding a threshold, increase cooling for the battery. The data is based on a surface temperature of at least one of the cells and a cell heating power parameter derived from a plurality of parameters including current output by one or more of the cells and via a delay timer and a filter having a sampling rate less than a sampling rate at which the current is measured.

DETAILED DESCRIPTION

Embodiments are described herein. It is to be understood, however, that the disclosed embodiments are merely examples and other embodiments may take various and alternative forms. The figures are not necessarily to scale. Some features could be exaggerated or minimized to show details of particular components. Therefore, specific structural and functional details disclosed herein are not to be interpreted as limiting, but merely as a representative basis for teaching one skilled in the art.

Various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

The present disclosure, among other things, proposes a system for operating a vehicle battery using internal bulk battery cell temperature estimated based on various factors.

Figure 1:
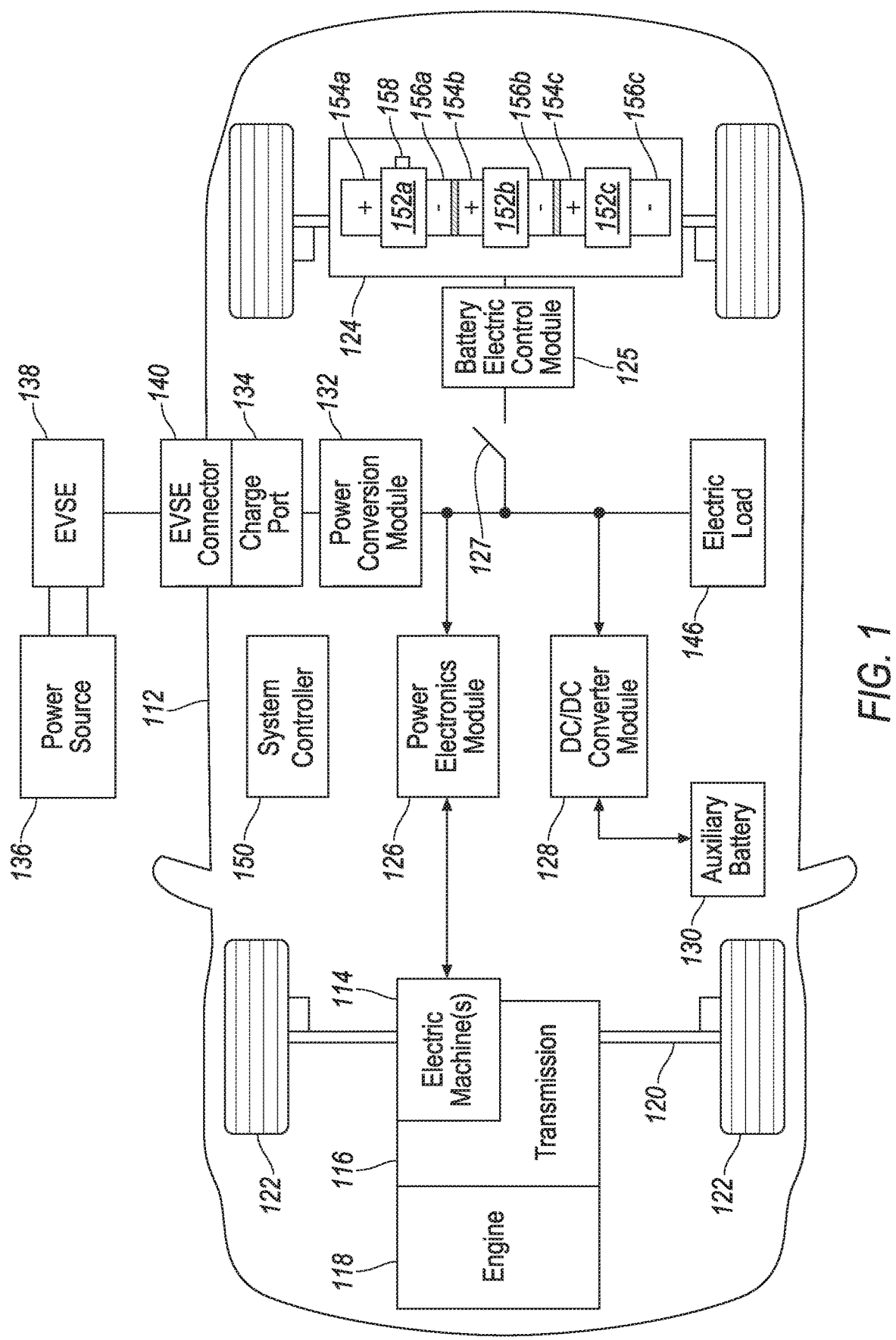
FIG. 1 is a diagram of an electrified vehicle illustrating drivetrain and energy storage components including an electric machine.

FIG. 1 illustrates a plug-in hybrid-electric vehicle (PHEV). A plug-in hybrid-electric vehicle 112 may comprise one or more electric machines (electric motors) 114 mechanically coupled to a hybrid transmission 116. The electric machines 114 may be capable of operating as a motor or a generator. In addition, the hybrid transmission 116 is mechanically coupled to an engine 118. The hybrid transmission 116 is also mechanically coupled to a drive shaft 120 that is mechanically coupled to the wheels 122. The electric machines 114 may provide propulsion and deceleration capability when the engine 118 is turned on or off. The electric machines 114 may also act as generators and may provide fuel economy benefits by recovering energy that would be lost as heat in the friction braking system. The electric machines 114 may also reduce vehicle emissions by allowing the engine 118 to operate at more efficient speeds and allowing the hybrid-electric vehicle 112 to be operated in electric mode with the engine 118 off under certain conditions.

A traction battery or battery pack 124 stores energy that may be used by the electric machines 114. A vehicle battery pack 124 may provide a high voltage DC output. The traction battery 124 may be electrically coupled to one or more battery electric control modules (BECM) 125. The BECM 125 may be provided with one or more processors and software applications configured to monitor and control various operations of the traction battery 124. The traction battery 124 may be further electrically coupled to one or more power electronics modules 126. The power electronics module 126 may also be referred to as a power inverter. One or more contactors 127 may isolate the traction battery 124 and the BECM 125 from other components when opened and couple the traction battery 124 and the BECM 125 to other components when closed. The power electronics module 126 may also be electrically coupled to the electric machines 114 and provide the ability to bi-directionally transfer energy between the traction battery 124 and the electric machines 114. For example, a traction battery 124 may provide a DC voltage while the electric machines 114 may operate using a three-phase AC current. The power electronics module 126 may convert the DC voltage to a three-phase AC current for use by the electric machines 114. In a regenerative mode, the power electronics module 126 may convert the three-phase AC current from the electric machines 114 acting as generators to the DC voltage compatible with the traction battery 124. The description herein is equally applicable to a pure electric vehicle. For a pure electric vehicle, the hybrid transmission 116 may be a gear box connected to the electric machine 114 and the engine 118 may not be present.

In addition to providing energy for propulsion, the traction battery 124 may provide energy for other vehicle electrical systems. A vehicle may include a DC/DC converter module 128 that converts the high voltage DC output of the traction battery 124 to a low voltage DC supply that is compatible with other low-voltage vehicle loads. An output of the DC/DC converter module 128 may be electrically coupled to an auxiliary battery 130 (e.g., 12V battery).

The vehicle 112 may be a battery electric vehicle (BEV) or a plug-in hybrid electric vehicle (PHEV) in which the traction battery 124 may be recharged by an external power source 136. The external power source 136 may be a connection to an electrical outlet. The external power source 136 may be an electrical power distribution network or grid as provided by an electric utility company. The external power source 136 may be electrically coupled to electric vehicle supply equipment (EVSE) 138. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for plugging into a charge port 134 of the vehicle 112. The charge port 134 may be any type of port configured to transfer power from the EVSE 138 to the vehicle 112. The charge port 134 may be electrically coupled to a charger or on-board power conversion module 132. The power conversion module 132 may condition the power supplied from the EVSE 138 to provide the proper voltage and current levels to the traction battery 124. The power conversion module 132 may interface with the EVSE 138 to coordinate the delivery of power to the vehicle 112. The EVSE connector 140 may have pins that mate with corresponding recesses of the charge port 134. Alternatively, various components described as being electrically coupled may transfer power using a wireless inductive coupling.

One or more electrical loads 146 may be coupled to the high-voltage bus. The electrical loads 146 may have an associated controller that operates and controls the electrical loads 146 when appropriate. Examples of electrical loads 146 may be a heating module, an air-conditioning module, or the like.

The various components discussed may have one or more associated controllers to control and monitor the operation of the components. The controllers may communicate via a serial bus (e.g., Controller Area Network (CAN)) or via discrete conductors. A system controller 150 may be present to coordinate the operation of the various components. It is noted that the system controller 150 is used as a general term and may include one or more controller devices configured to perform various operations in the present disclosure. For instance, the system controller 150 may be programmed to enable a powertrain control function to operate the powertrain of the vehicle 112. The system controller 150 may be further programmed to enable a telecommunication function with various entities (e.g. a server) via a wireless network (e.g. a cellular network).

The traction battery 124 may be a rechargeable battery made of one or more rechargeable cells (e.g. lithium-ion cells). As an example, the cells may be of a pouch or prismatic cell type connected in series. As illustrated in FIG. 1, an example battery cell configuration of the traction battery 124 is illustrated. The traction battery 124 may include a plurality of pouch type battery cells 152 connected to each other via one or more battery cell tabs. a first battery cell 152*a* may include a first anode cell tab 154*a* and a cathode cell tab 156*a*; a second battery cell 152*b* may include a second anode cell tab 154*b* connected to the first cathode cell tab 156*a* of the first battery cell 152 and a second cathode cell tab 156*b*; and a third battery cell 152*c* may include a third anode cell tab 154*c* connected to the second cathode cell tab 156*b* of the second battery cell 152*b* and a third cathode cell tab 156*c*. Although the battery cells 152 are connected in series in the present example illustrated with reference to FIG. 1, the present disclosure is not limited thereto and any other connection configurations as required by the specific design may be covered by the present disclosure under essentially the same concept. Further, although the cell tabs 154, 156 of different cells are directly connected to each other in the present example, intermediary materials (e.g. cable, harness, busbars) may be applied to the present disclosure under essentially the same concept.

The system controller 150 and/or BECM 125, individually or combined, may be programmed to perform various operations with regard to the traction battery 124. For instance, the system controller 150 and/or BECM 125 may be configured to measure and estimate the internal cell temperature based on various factors. Although the battery cell temperature may be generally measured via one or more temperature sensors, the measured data usually does not accurately reflect the internal temperature of the cells because the sensors are located outside the cells. The present disclosure proposes a method to determine the internal cell temperature based on the outside measured temperature as well as various factors such as battery current. Different battery cells 152 may be associated with different internal temperatures due to factors such as the location within the battery 124 subject to different ventilation and heat dissipation conditions. However, in the present disclosure, a single internal temperature of the cells 152 may be collectively referred to as a battery cell bulk temperature.

As discussed above, the traction battery pack 124 may be provided with one or more temperature sensors 158 configured to measure the temperature of the battery cells 152. The temperature sensors 158 may be implemented in various manners. For instance, the temperature sensors 158 may include one or more thermistors configured to measure the temperature of the battery cells 152 using the resistance of a resistor. As illustrated in FIG. 1, a temperature sensor 158 may be located near the first battery cell 152*a* to measure the temperature of the first cell 152*a*. Due to various reasons, it may be impractical to provide each battery cell 152 with a separate temperature sensor 158. Therefore, the number of temperature sensors 158 may be significantly less than the number of battery cells 152. If multiple temperature sensors 158 are provided, the system controller 150 and/or BECM 125 may determine a single battery temperature using the multiple readings (e.g. an average temperature).

Figure 2:
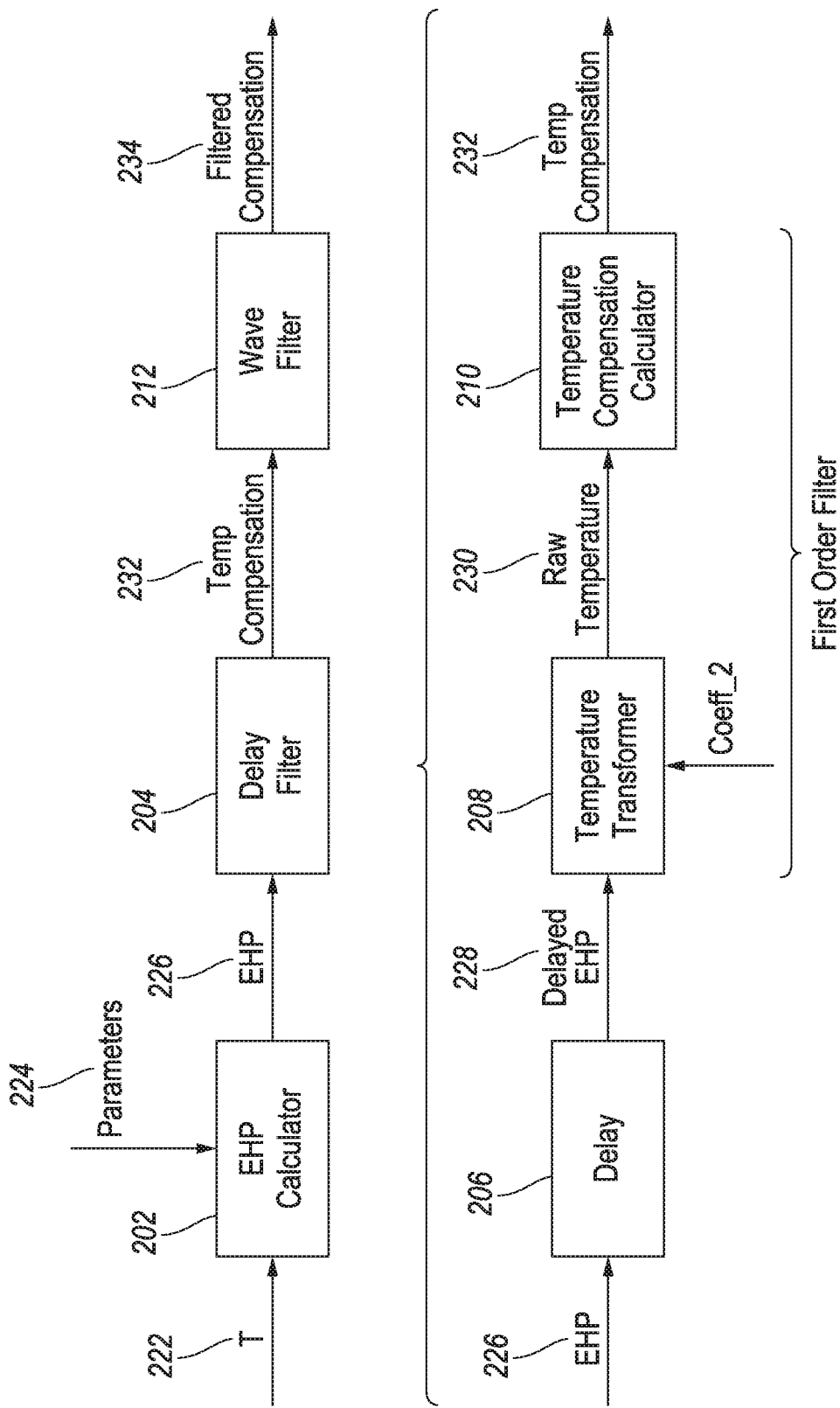
FIG. 2 is an example block diagram of a battery cell bulk temperature compensation system.

Referring to FIG. 2, an example block diagram of a battery cell bulk temperature estimation compensation system 200 is illustrated. With continuing reference to FIG. 1, the system 200 may be implemented via the system controller 150 and/or the BECM 125, as well as other components of the vehicle 112 individually or collectively. For simplicity purpose, the following description will be made with reference to the system controller 150. As discussed above, the sensor measured cell surface temperature may not accurately reflect the internal temperature of the battery cells 152. However, the internal temperature of the cells 152 is correlated to the external cell temperature. In the present disclosure, the correlation between the surface and cell bulk temperatures may be represented as a temperature compensation. The battery cell estimated bulk temperature compensation system 200 may be configured to derive the cell bulk temperature using the measured external temperature and the temperature compensation. The system 200 may include an equivalent heat power (EHP) calculator 202 configured to calculate an EHP 216 based on a variety of input data. The EHP may be indicative of a difference of net heat in the same heat mass unit between battery bulk and surface location where the thermal sensor 158 is located. The net heat may be indicative of a difference between the heat that is generated and the heat that is dissipated in the heat mass unit (i.e. one or more of the battery cells 152 in the present example). The heat that is dissipated may be further indicative of the heat flowing out the heat mass unit minus that heat flowing into the heat mass unit. Alternatively, the EHP may be represented using the following equation:

$$EHP = \frac{\text{heat}_{gen\_bulk} - (\text{heat}_{out\_bulk} - \text{heat}_{in\_bulk})}{m_t} - \frac{\text{heat}_{gen\_surface} - (\text{heat}_{out\_surface} - \text{heat}_{in\_surface})}{m_t} \quad (1)$$

wherein $m_t$ denotes the thermal mass of the heat mass unit (i.e. one or more of the battery cells 152 in the present example). The input data to the EHP calculator 202 may include the sensor measured surface temperature T 222 and various parameters 224 such as the charging/discharging current I of the battery cells 152. The EHP may be calculated using the following equation:

$$EHP = \text{Coeff\_1} \times \alpha(SOC) \times e^{\beta\left(\frac{1}{T} - \frac{1}{T_{ref}}\right)} \times I^2 \quad (2)$$

As illustrated by equation (2), the EHP is proportional to the square of the current and further affected by other factors. In the present example, the temperature effect on EHP is reflected by the Arrhenius equation which is an exponential equation of the inversed temperature as represented by $$e^{\beta\left(\frac{1}{T} - \frac{1}{T_{ref}}\right)},$$

wherein T denotes the sensor measured cell surface temperature, and $\beta$ denotes a coefficient of energy which may be expressed as a function of the state of charge (SOC) of the battery cells 152. Alternatively, the energy coefficient $\beta$ may be a constant. In the present example, $\beta$ may range from 500 to 6000. In either case, the energy coefficient $\beta$ may be calibrated to the specific implementation of the EHP calculation system. $T_{ref}$ denotes a constant temperature value calibrated to the specific implementation of the EHP calculation system. In the present example, $T_{ref}$ may be equal to 273+/−50 degrees Kelvin (K). The EHP may be further affected by the SOC as represented as $\alpha(SOC)$ in equation (2). $\alpha$ denotes a calibration function that is determined by testing data performed at different SOC levels of the cells 152 or derived from battery model simulations. As an example, $\alpha(SOC)$ is a function of SOC with a normal lookup table representation. The EHP is further affected by a first calibrated coefficient Coeff_1 that reflects the net heat difference between the measured battery surface temperature and the bulk temperature. The first calibrated coefficient Coeff_1 may further reflect different stages of battery aging. For instance, as the battery cells 152 age, the internal resistance of the cells 152 increases causing the first calibrated coefficient Coeff_1 to increase. The first calibrated coefficient Coeff_1 may relate to a net heat difference between measured cell surface temperature and the bulk internal temperature. As an example, the first calibrated coefficient Coeff_1 may be further proportional to the difference between measured cell surface temperature and the bulk internal temperature. Further, both $\alpha(SOC)$ and energy coefficient $\beta$ may be affected by the battery aging. In the present example, the first calibrated coefficient Coeff_1 may range from 0.01 to 1.

Based on the above equation (2), a raw EHP 226 may be determined and fed to a delay filter 204 for further processing. In one aspect of the present disclosure, the delay filter 204 may be configured to resemble the time delay associated with the heat propagation effect within the cell bulk. In another aspect, the delay filter may be further configured to convert the EHP to the temperature compensation (to be discussed in detail below). In general, the heating power may not immediately lead to the temperature rise within the battery cells 152 and there is usually a time delay between the occurrence of the heating power and the increase of cell temperature. This time delay is particularly applicable for the large format battery cells 152 that are utilized in the vehicle traction battery 124 due to the complexity of heat transfer and ventilation design. In this regard the delay filter 204 may include a delay timer calibrated to reflect the timing component of heat propagation of the cells 152 within the traction battery 124. As an example, the delay timer may be set to a fixed value to shift the EHP input by an amount of time (e.g. a few seconds). Alternatively, a variable delay timer may be used and the value of the timer may be affected by factors such as the magnitude of the current (e.g. higher current may cause shorter delays), battery health/age (e.g. aged battery may cause longer delay) or the like.

The delay timer 206 may output a delayed EHP 228 to a temperature transformer 208 configured to transform the delay EHP 228 in units of Watts to a raw temperature 230 within a sampling time ts. In the present example, a second coefficient Coeff_2 may be introduced to the temperature transformer 208 to perform the transformation. Similar to the first coefficient Coeff_1, the second coefficient Coeff_2 may be a calibrated conversion factor in units of Kelvin per second watt (K/sW). As an example, the conversion factor Coeff_2 may be affected by the battery design. The raw temperature 230 may be represented using the following equation:

Raw_temp=Coeff_2×ts×Delayed_EHP    (2)

The raw temperature 230 may be output to a temperature compensation calculator 210 configured to calculate the temperature compensation 232. The calculation may be performed using the following equation:

T(k)=Weight×T(k−1)+Raw_temp    (3)

The weight in the above equation may be a calibrated parameter ranging between 0 and 1 that is introduced into the system to discount the past temperature effect. A limit which constrains the value of T(k) in a calibrated range may be used. For instance, a temperature compensation value T(k) should not exceed 5 degrees Celsius in an example. An anti-windup algorithm may be added between signals before and after the limit to prevent the value before the limit windup.

In one example, the temperature transformer 208 and the temperature compensation calculator 210 may be implemented as a first order filter. The temperature compensation calculator 232 may output the temperature compensation 232 to a wave filter 212 for further processing. One of the purposes of the wave filter is to prevent rapid temperature change that is caused by a rapid change in the current, contradicting the actual battery cell bulk temperature variation which happens smoothly. The wave filter 206 may be implemented in various manners. For instance, the wave filter 206 may be implemented as a first order filter configured to execute a sampling rate much slower than the sampling rate of the current I. The slower sampling rate may be further implemented via a counter in an example. Once the total samples received by the wave filter 206 reaches a predefined threshold, the counter may be reset to zero and the wave filter 206 is executed once. The threshold for the counter may be a fixed value. Alternatively, a variable threshold may be used to be affected by parameters such as the current (e.g. higher current may reduce the threshold), battery health (e.g. aged battery may increase the threshold) or the like. The wave filter 212 may output a filtered temperature compensation 234 to allow the system controller 150 to determine the internal cell bulk temperature. For instance, the internal cell bulk temperature may be represented using the following equation:

$$T_{Bulk}=T_{Surface}+T_{Compensation} \quad (4)$$

wherein $T_{Surface}$ denotes the sensor measured cell surface temperature.

The system controller 150 may be configured to perform various operations of the vehicle 112 based on the internal cell bulk temperature. For instance, the system controller 150 may modify the battery power output based on the bulk temperature. In an example, responsive to the cell bulk temperature $T_{Bulk}$ as calculated being over the temperature threshold, the system controller 150 may take mitigation measures by reducing the output power from the battery 124 to reduce heat generation. In an alternative example, when the ambient temperature is low (e.g. winter condition), the system controller 150 may adjust the battery power proportional to the bulk temperature as determined within a range. In response to the bulk temperature increasing above a threshold indicative of the battery 124 being warmed up, for instance, the system controller 150 may increase the power output from the battery 124. Additionally or alternatively, the controller 150 may operate the battery heating and/or cooling based on the bulk temperature. For instance, in response to detecting a amount of heat generated during the vehicle operation as reflected by the bulk temperature, the system controller 150 may increase battery cooling (e.g. coolant circulation, ventilation) to increase the heat dissipation of the battery 124. Alternatively, the system controller 150 may activate and adjust the battery heating responsive to the bulk temperature being less than a threshold (e.g. winter condition).

The algorithms, methods, or processes disclosed herein can be deliverable to or implemented by a computer, controller, or processing device, which can include any dedicated electronic control unit or programmable electronic control unit. Similarly, the algorithms, methods, or processes can be stored as data and instructions executable by a computer or controller in many forms including, but not limited to, information permanently stored on non-writable storage media such as read only memory devices and information alterably stored on writeable storage media such as compact discs, random access memory devices, or other magnetic and optical media. The algorithms, methods, or processes can also be implemented in software executable objects. Alternatively, the algorithms, methods, or processes can be embodied in whole or in part using suitable hardware components, such as application specific integrated circuits, field-programmable gate arrays, state machines, or other hardware components or devices, or a combination of firmware, hardware, and software components.

While exemplary embodiments are described above, it is not intended that these embodiments describe all possible forms encompassed by the claims. The words used in the specification are words of description rather than limitation, and it is understood that various changes may be made without departing from the spirit and scope of the disclosure. The words processor and processors may be interchanged herein, as may the words controller and controllers.

As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to strength, durability, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A vehicle comprising:
a battery including a plurality of cells;
a temperature sensor located at a surface of one of the cells to measure a surface temperature;
a motor; and
one or more controllers programmed to, responsive to data indicative of an internal cell temperature of one or more of the cells exceeding a threshold, decrease power output from the battery to the motor, wherein the data is based on the surface temperature and a cell heating power parameter derived from a plurality of parameters, including a current output by one or more of the cells, and via a delay timer and a filter having a first sampling rate less than a second sampling rate at which the current is measured.

2. The vehicle of claim 1, wherein the one or more controllers is further programmed to adjust the first sampling rate according to the current or a health of the battery.

3. The vehicle of claim 1, wherein the one or more controllers is further programmed to adjust the delay timer according to the current or a health of the battery.

4. The vehicle of claim 1, wherein the parameters include a state of charge of the battery.

5. The vehicle of claim 1, wherein the cell heating power parameter is further derived via Arrhenius equation.

6. A method for a vehicle including a motor and a traction battery with a plurality of cells, comprising:
measuring a surface temperature of one of the cells; and
responsive to data describing an internal cell temperature of one or more of the cells exceeding a threshold, adjusting power output from the traction battery to the motor, wherein the data is derived from the surface temperature and a temperature compensation factor that is based on output resulting from a plurality of parameters, including a current from one or more of the cells, and being processed via a delay timer and a first order filter having a first sampling rate less than a second sampling rate at which the current is measured.

7. The method of claim 6 further comprising adjusting the first sampling rate according to the current or a health of the traction battery.

8. The method of claim 6 further comprising adjusting the delay timer according to the current or a health of the traction battery.

9. The method of claim 6, wherein the parameters include state of charge of the traction battery.

10. The method of claim 6, wherein the output defines a cell heating power parameter.

11. A vehicle power system comprising:

a battery including a plurality of cells; and one or more controllers programmed to, responsive to data describing an internal cell temperature of one or more of the cells exceeding a threshold, adjust cooling for the battery, wherein the data is based on a surface temperature of at least one of the cells and a cell heating power parameter derived from a plurality of parameters, including current output by one or more of the cells, and via a delay timer and a filter having a sampling rate less than a sampling rate at which the current is measured.

12. The vehicle power system of claim 11, wherein the one or more controllers are further programmed to adjust the sampling rate of the filter according to the current or a health of the battery.

13. The vehicle power system of claim 11, wherein the one or more controllers are further programmed to adjust the delay timer according to the current or a health of the battery.

14. The vehicle power system of claim 11, wherein the filter is a wave filter.

15. The vehicle power system of claim 11, wherein the parameters further include a state of charge of the battery.

16. The vehicle power system of claim 11, wherein the one or more controllers are further programmed to increase the cooling of the battery.

17. The vehicle power system of claim 11, wherein the one or more controllers are further programmed to decrease the cooling of the battery.

* * * * *